(12) United States Patent
Inaba et al.

(10) Patent No.: US 7,655,569 B2
(45) Date of Patent: Feb. 2, 2010

(54) METHOD OF MANUFACTURING SEMICONDUCTOR DEVICE

(75) Inventors: Yuichi Inaba, Ota (JP); Yutaka Yamada, Ota (JP); Shigehiro Morikawa, Ora-Gun (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 12/020,761

(22) Filed: Jan. 28, 2008

(65) Prior Publication Data

US 2009/0011603 A1    Jan. 8, 2009

(30) Foreign Application Priority Data

Jan. 31, 2007   (JP)  ............................. 2007-021409

(51) Int. Cl.
*H01L 21/311* (2006.01)

(52) U.S. Cl. .................. 438/703; 438/584; 438/634; 438/689; 257/E21.68; 257/E21.667

(58) Field of Classification Search .................. 438/703
See application file for complete search history.

(56) References Cited

U.S. PATENT DOCUMENTS 4,853,761 A * 8/1989 Ikeda .......................... 257/323
2003/0080428 A1 * 5/2003 Izumitani et al. ............ 257/758
2004/0166696 A1 * 8/2004 Lee ............................. 438/792
2005/0161825 A1 * 7/2005 Watanabe ................... 257/758

FOREIGN PATENT DOCUMENTS

JP     2005-243127     9/2005

* cited by examiner

*Primary Examiner*—Alexander G Ghyka
*Assistant Examiner*—Abdulfattah Mustapha
(74) *Attorney, Agent, or Firm*—Morrison & Foerster LLP

(57) ABSTRACT

The invention prevents a wiring layer in a memory region from being exposed to prevent a change in wire resistance and degradation of reliability. A $SiO_2$ film as an etching stopper film which transmits ultraviolet light is formed on pad electrodes and an interlayer insulation film. Then, the $SiO_2$ film on the pad electrodes is etched selectively and the $SiO_2$ film in an EPROM region is left. A silicon nitride film and a polyimide film are then formed on the $SiO_2$ film and on the pad electrodes where the $SiO_2$ film is removed, as a protection film which does not transmit ultraviolet light. The silicon nitride film and the polyimide film on the pad electrodes and in the EPROM region are then selectively removed by etching. Since the $SiO_2$ film functions as an etching stopper at this time, the interlayer insulation film under the $SiO_2$ film is prevented from being etched and a control gate line metal layer is prevented from being exposed.

5 Claims, 5 Drawing Sheets

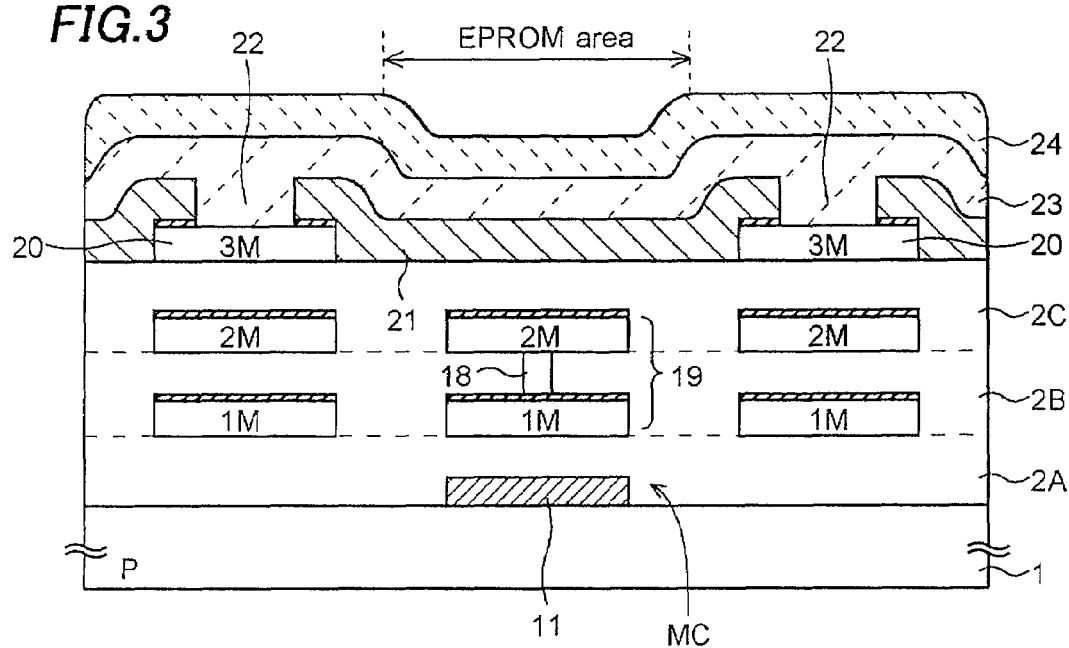
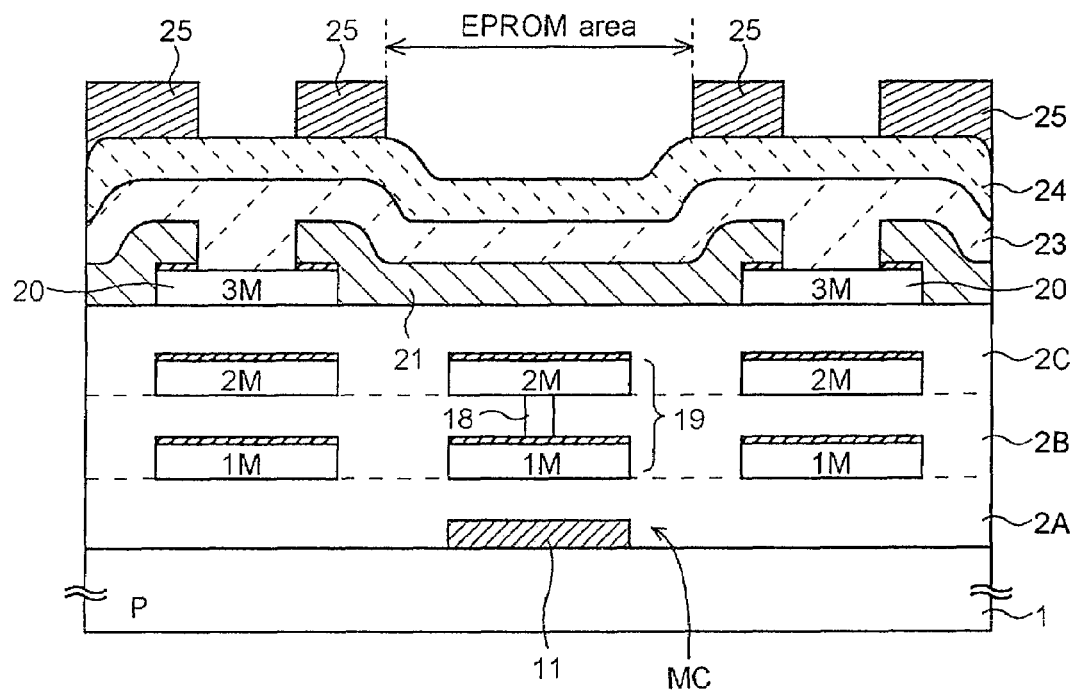

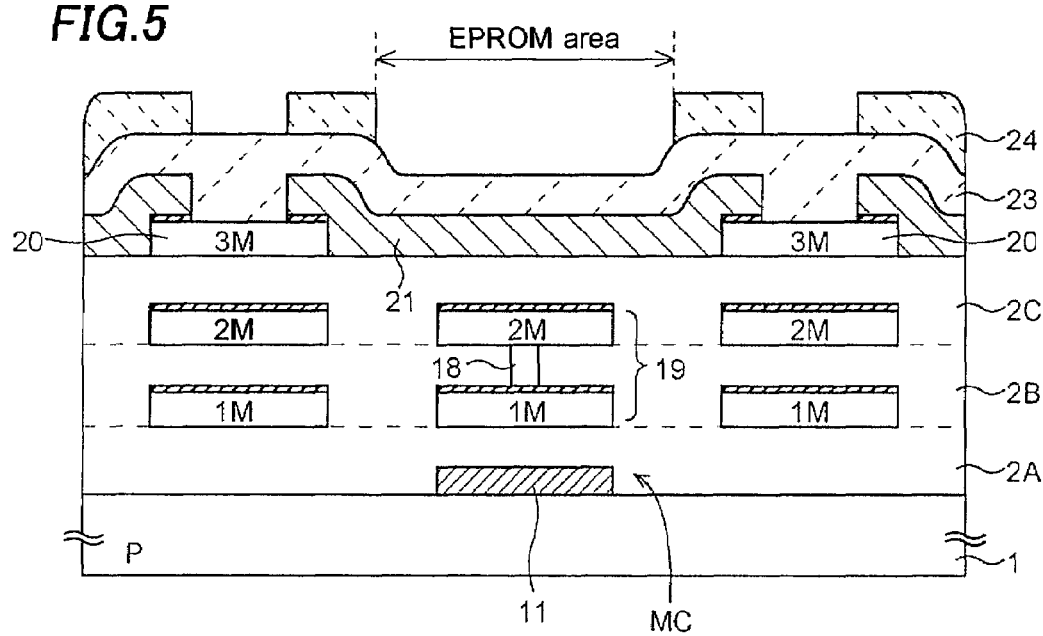
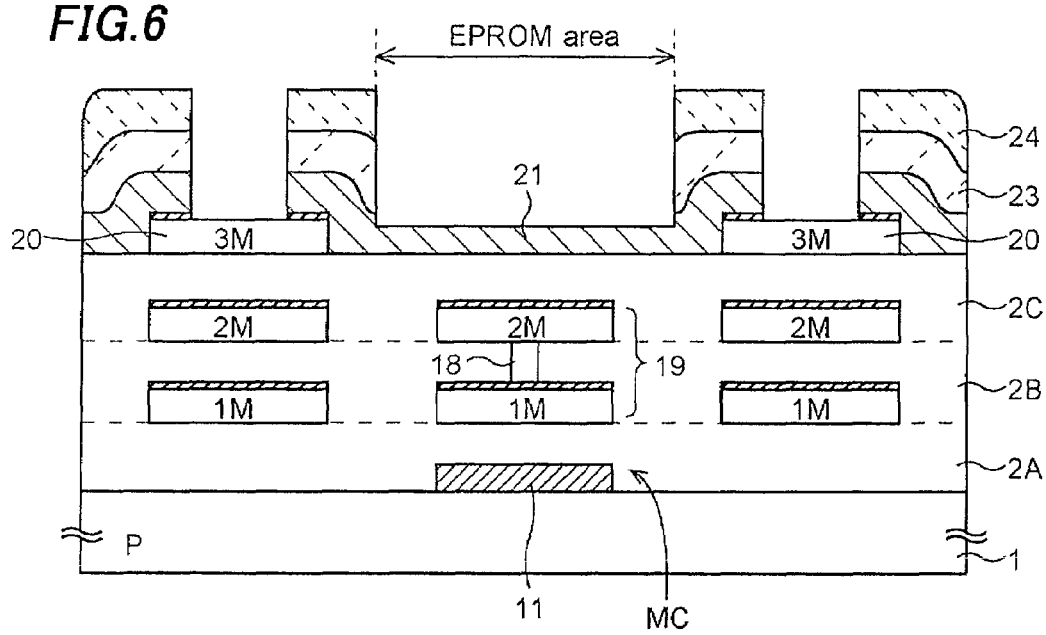

METHOD OF MANUFACTURING SEMICONDUCTOR DEVICE

CROSS-REFERENCE OF THE INVENTION

This application claims priority from Japanese Patent Application No. 2007-021409, the content of which is incorporated herein by reference in its entirety.

BACKGROUND OF THE INVENTION

1. Field of the Invention

The invention relates to a method of manufacturing a semiconductor device, particularly, a method of manufacturing a semiconductor device having an ultraviolet erasable nonvolatile memory cell.

2. Description of the Related Art

An ultraviolet EPROM (Erasable Programmable Read-Only Memory) is a memory where electrically written data is erasable by ultraviolet irradiation, and is formed on a semiconductor substrate by itself or by being integrated into other semiconductor integrated circuit, for example, a microcomputer.

A silicon nitride film as a passivation film and a polyimide film as a buffer against stress of a package are often formed on a semiconductor substrate formed with this EPROM. However, these silicon nitride film and polyimide film have a property of not transmitting ultraviolet light, the data erasing of the EPROM is not achievable if these are left on the EPROM region. Therefore, these films on the EPROM region are removed by etching. For reducing the number of processes, the removing of these films on the EPROM region by etching is performed at the same time as when a silicon nitride film or the like on pad electrodes for wire bonding is removed by etching. An ultraviolet EPROM is described in Japanese Patent Application Publication No. 2005-243127.

When the silicon nitride film or the like on the pad electrodes is removed by etching, however, over-etching is performed for exposing the pad electrodes completely. This causes an interlayer insulation film to be etched to expose a wiring layer under the pad electrodes in the EPROM region. When the wiring layer is exposed, the reliability of the EPROM is degraded by water infiltration or the like. Furthermore, since the exposed wiring layer is damaged by etching, the resistance of the wiring layer changes.

SUMMARY OF THE INVENTION

The invention provides a method of manufacturing a semiconductor device including a memory region including an ultraviolet erasable memory cell and a wiring layer connected to this memory cell, an interlayer insulation film covering the memory cell and the wiring layer, and an external connection electrode formed above the wiring layer with the interlayer insulation film being interposed therebetween at a distance from the memory region, forming an etching stopper film that transmits ultraviolet light on the external connection electrode and the interlayer insulation film; selectively etching the etching stopper film so as to expose the external connection electrode and leave the etching stopper film on the memory region; forming a protection film that does not transmit ultraviolet light on the etching stopper film and the external connection electrode where the etching stopper film is removed; and selectively etching the protection film so as to expose the external connection electrode and the etching stopper film on the memory region.

BRIEF DESCRIPTION OF THE DRAWINGS

FIGS. 1 to 6, 8 are cross-sectional views for explaining a method of manufacturing a semiconductor device of an embodiment of the invention.

DETAILED DESCRIPTION OF THE INVENTION

A method of manufacturing a semiconductor device of an embodiment of the invention will be described referring to figures.

Figure 1:
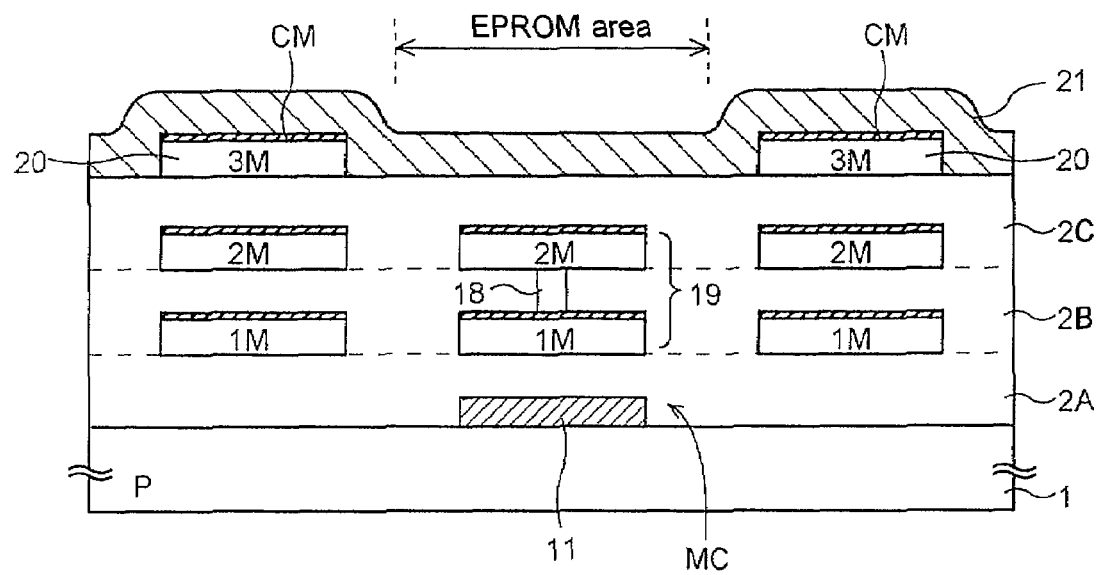

As shown in FIG. 1, a memory cell MC is formed in an EPROM region on a P-type semiconductor substrate 1. Although there is a plurality of memory cells MC actually, FIG. 1 schematically shows a floating gate 11 of one memory cell MC only. This semiconductor device is formed by a three-layer metal process, and a first metal layer 1M, a second metal layer 2M and a third metal layer 3M are formed above the floating gate 11 of the memory cell MC with interlayer insulation films 2A, 2B and 2C being interposed therebetween respectively. The interlayer insulation films 2A, 2B and 2C are made of a layered film (the thickness is about 950 nm) of a TEOS film/a SOG film/a TEOS film, for example, and are planarized. The interlayer insulation films 2A, 2B and 2C have a property of transmitting ultraviolet light.

Figure 7:
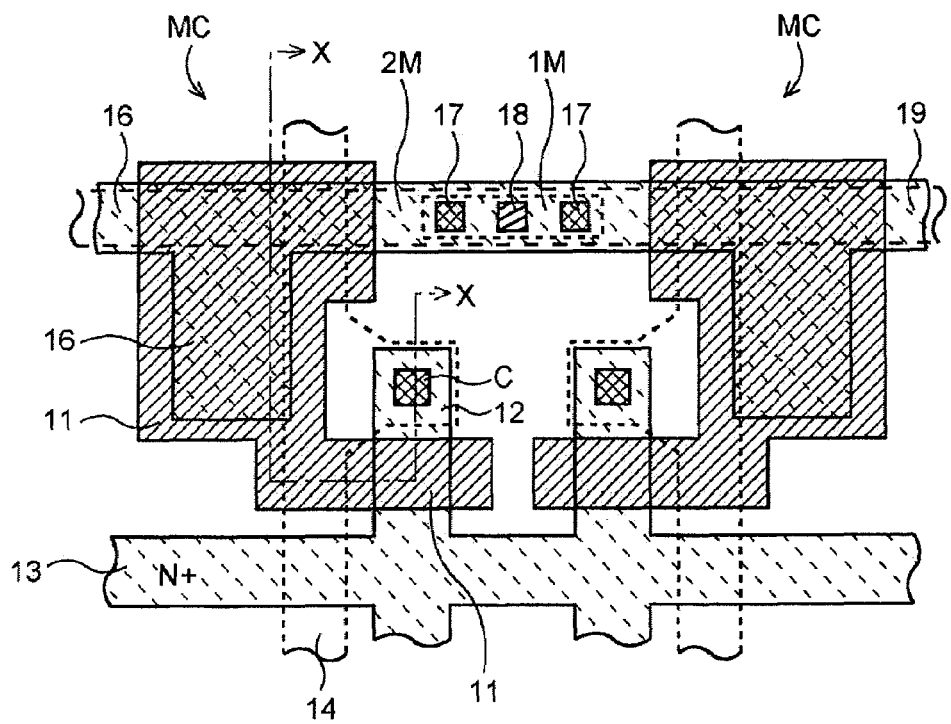
FIG. 7 is a plan view for explaining the method of manufacturing the semiconductor device of the embodiment of the invention.
Figure 8:
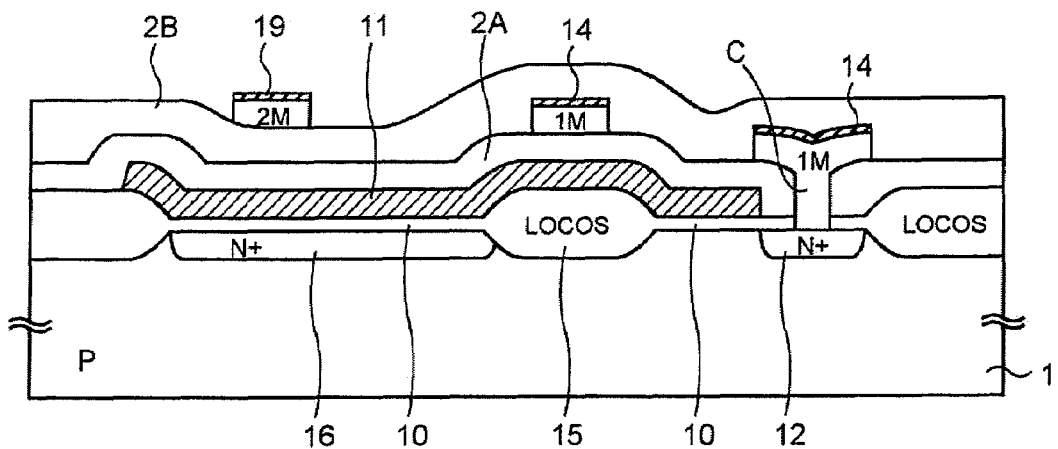

The structure of the memory cell MC will be described referring to FIGS. 7 and 8. FIG. 7 is a plan view of the memory cells MC, showing two memory cells MC disposed adjacently and symmetrically. FIG. 8 is a cross-sectional view of FIG. 7 along line X-X.

The floating gate 11 made of a polysilicon or the like is formed on the P-type semiconductor substrate 1 with a gate insulation film 10 being interposed therebetween. Near the floating gate 11, an $N^+$-type drain diffusion layer 12 and an $N^+$-type source line diffusion layer 13 are formed on the P-type semiconductor substrate 1. The interlayer insulation film 2A is formed on the floating gate 11. A contact hole C is formed in the interlayer insulation film 2A on the $N^+$-type drain diffusion layer 12, and a bit line 14 is formed being connected to the drain diffusion layer 12 through this contact hole C.

Figure 9:
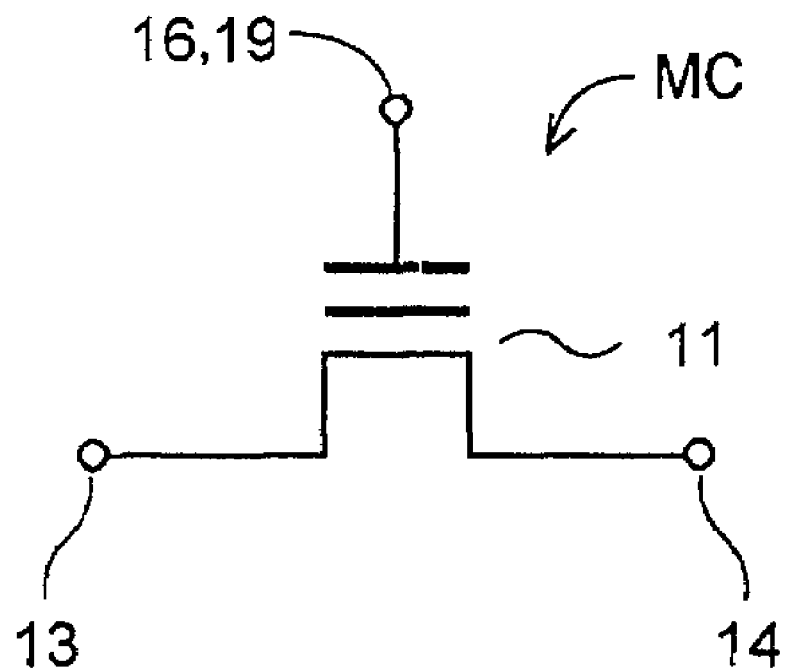
FIG. 9 is an equivalent circuit diagram of a memory cell.

Furthermore, an $N^+$-type control gate line diffusion layer 16 is formed on the semiconductor substrate 1, forming a stripe-like shape like the source line diffusion layer 13. The floating gate 11 crosses over a LOCOS film 15 and extends onto the $N^+$-type control gate line diffusion layer 16. The floating gate 11 and the $N^+$-type control gate line diffusion layer 16 are capacitively coupled with the gate insulation film 10 being interposed therebetween. Furthermore, since the control gate line diffusion layer 16 has a high resistance, for the control gate line diffusion layer 16, the first metal layer 1M is formed being connected to this control gate line diffusion layer 16 through a via hole 17 and the second metal layer 2M is further formed being connected to this first metal layer 1M through a via hole 18. These first metal layer 1M and second metal layer 2M form a control gate line metal layer 19. The control gate line metal layer 19 and the control gate line diffusion layer 16 integrally serve as a control gate line. This memory cell MC is shown by an equivalent circuit diagram in FIG. 9.

For writing data in this memory cell MC, a high voltage is applied to the bit line 14 to flow a channel current. Then, hot electrons by this channel current are injected into the floating gate 11. This makes the threshold voltage of the transistor high, completing the data writing. Furthermore, for erasing the data written in the memory cell MC, ultraviolet light is irradiated to the memory cell MC. By this, the electrons injected in the floating gate 11 are extracted and the threshold voltage of the transistor returns back, completing the data erasing.

As shown in FIG. 1, pad electrodes 20 for wire bonding made of the third metal layer 3M are formed at a distance from the EPROM region. The pad electrode 20 is an input and output pad of a circuit (not shown) formed on the semiconductor substrate 1. The pad electrode 20 is made of, for example, an aluminum layer having a thickness of 450 nm and a cap metal layer CM having a thickness of 30 nm covering the front surface of this aluminum layer. The cap metal layer CM is a reflection preventing layer for preventing reflection by exposure for patterning the third metal layer 3M, and made of, for example, a TiN layer (a titanium nitride layer). Then, an oxide film 21 (e.g. a silicon oxide film or a TEOS film) having a thickness of about 300 nm is formed on the whole surface, covering the pad electrodes 20. This oxide film 21 has a property of transmitting ultraviolet light.

Figure 2:
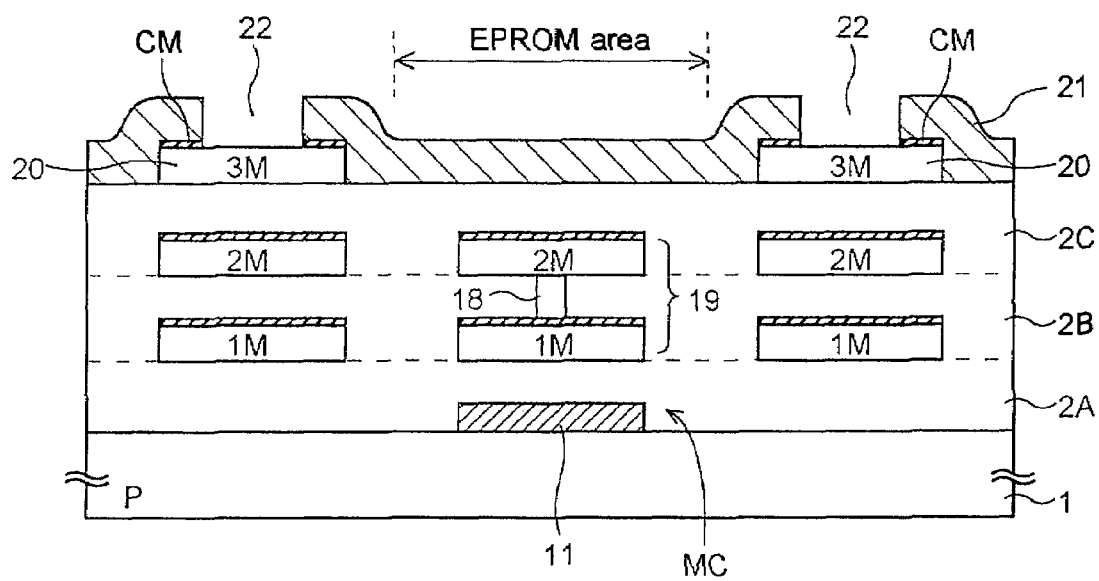

Then, as shown in FIG. 2, the oxide film 21 is selectively etched to form openings 22 and expose the pad electrodes 20. At this time, the oxide film 21 on the EPROM region (which functions as an etching stopper film in the subsequent etching process) is left as it is. Furthermore, the cap metal layers CM of the pad electrodes 20 are removed by over-etching. This is for reducing the contact resistance between bonding wires and the pad electrodes 20.

Then, as shown in FIG. 3, a silicon nitride film 23 having a thickness of about 400 nm is deposited on the oxide film 21 and in these openings 22 by a CVD method, and then a polyimide film 24 having a thickness of about 3 μm is coated on this silicon nitride film 23. The silicon nitride film 23 functions as a passivation film. The oxide film 21 under the silicon nitride film 23 also functions as a buffer against stress by the silicon nitride film 23. The polyimide film 24 is used as a buffer against stress by a package.

Then, as shown in FIG. 4, a resist film 25 is formed on the polyimide film 24, and openings are formed therein in the EPROM region and on the pad electrodes 20 by exposure and development. The polyimide film 24 is then etched using this patterned resist film 25 as a mask. Then, the resist film 25 is removed as shown in FIG. 5.

Then, as shown in FIG. 6, the silicon nitride film 23 is removed by etching using the polyimide film 24 as a mask to expose the pad electrodes 20 again. At this time, the silicon nitride film 23 in the EPROM region is completely removed. This realizes proper wire bonding to the pad electrodes 20. Furthermore, since the silicon nitride film 23 and the polyimide film 24 which do not transmit ultraviolet light are removed in the EPROM region, this realizes erasing of the data of the memory cell MC accumulated in the floating gate 11 by ultraviolet light.

When the silicon nitride film 23 is etched as described above, since this oxide film 21 thereunder functions as an etching stopper film although the oxide film 21 is also slightly etched in the EPROM region, the interlayer insulation film 2C thereunder is prevented from being etched and thus the control gate line metal layer 19 is prevented from being exposed. This prevents a change in wire resistance of the control gate line metal layer 19 and degradation of reliability.

Although the description is given using the three-layer metal process as an example in this embodiment, the invention is similarly applicable to any process as long as the pad electrodes 20 are formed above the wiring layer in the memory region. Furthermore, the memory cell MC may be a memory cell having other structure (e.g. a stack type structure) as long as it is an ultraviolet erasable memory cell.

The invention prevents the interlayer insulation film in the memory region from being etched by the etching stopper film when the protection film which does not transmit ultraviolet light is etched. This prevents the wiring layer in the memory region from being exposed, thereby preventing a change in wire resistance and degradation of reliability.

What is claimed is:

1. A method of manufacturing a semiconductor device, comprising:
    providing a device intermediate comprising a semiconductor substrate, an ultraviolet erasable memory cell formed on the substrate, a wiring layer connected to the memory cell and formed on the substrate, an interlayer insulation film covering the memory cell and the wiring layer, and an external connection electrode formed on the interlayer insulation film away from the memory cell;
    forming an etching stopper film that transmits ultraviolet light to cover the external connection electrode and the interlayer insulation film;
    etching the etching stopper film so as to expose the external connection electrode and to leave the memory cell covered by the etching stopper film;
    forming a protection film that does not transmit ultraviolet light to cover the remaining etching stopper film and the exposed external connection electrode; and
    etching the protection film so as to expose the external connection electrode and the etching stopper film covering the memory cell.

2. The method of claim 1, wherein the etching stopper film comprises a silicon oxide film.

3. The method of claim 1, wherein the protection film comprises a silicon nitride film.

4. The method of claim 1, wherein the protection film comprises a silicon nitride film and a polyimide film.

5. The method of claim 1, further comprising irradiating the memory cell with ultraviolet light through the etching stopper film exposed in the etched protection film.

* * * * *